United States Patent
Huang

(10) Patent No.: US 7,441,592 B2
(45) Date of Patent: Oct. 28, 2008

(54) COOLER MODULE

(76) Inventor: Tsung-Hsien Huang, No. 18-28, Ta Hu Rd., Hu Pei Village, Yuan Shan Hsiang, I-Lan Hsien (TW)

( * ) Notice: Subject to any disclaimer, the term of this patent is extended or adjusted under 35 U.S.C. 154(b) by 30 days.

(21) Appl. No.: 11/563,202

(22) Filed: Nov. 26, 2006

(65) Prior Publication Data

US 2008/0121378 A1 May 29, 2008

(51) Int. Cl.
*F28D 15/00* (2006.01)
*F28F 7/00* (2006.01)
*H05K 7/20* (2006.01)

(52) U.S. Cl. ............. 165/104.33; 165/80.3; 165/104.21

(58) Field of Classification Search ............ 165/104.33, 165/104.34, 104.21, 80.3, 185, 168; 361/699, 361/700; 257/715; 174/15.2, 16.3
See application file for complete search history.

(56) References Cited

U.S. PATENT DOCUMENTS

| | | | | |
|---|---|---|---|---|
| 3,387,653 A * | 6/1968 | Coe | ............................ | 165/165 |
| 7,036,566 B1 * | 5/2006 | Huang | .................... | 165/104.33 |
| 7,051,792 B2 * | 5/2006 | Lee et al. | ................ | 165/104.21 |
| 7,275,587 B2 * | 10/2007 | Kuo | ........................... | 165/80.3 |
| 2005/0195569 A1 * | 9/2005 | Hsu | ........................... | 361/697 |
| 2007/0044942 A1 * | 3/2007 | Mou | ..................... | 165/104.33 |
| 2007/0215327 A1 * | 9/2007 | Lai et al. | ................ | 165/104.33 |

* cited by examiner

*Primary Examiner*—Tho v Duong
(74) *Attorney, Agent, or Firm*—Pai Patent & Trademark Law Firm; Chao-Chang David Pai

(57) ABSTRACT

A cooler module includes a metal base member, which has accommodation grooves, clamping strips respectively extending along two sides of each accommodation groove, and positioning grooves between each two adjacent accommodation grooves; U-shaped heat tubes that have the respective bottom ends accommodated in the accommodation grooves and secured thereto by the clamping strips of the base member; and radiation fins, which have through holes that receive the top ends of the heat tubes, a plurality of bottom notches respectively attached to the periphery of the bottom ends of the heat tubes, and a plurality of positioning strips respectively engaged into the positioning grooves of the base member.

8 Claims, 6 Drawing Sheets

COOLER MODULE

BACKGROUND OF THE INVENTION (a) Field of the Invention

The present invention relates to a cooler module and more particularly to an improved structure of cooler module, which has clamping strips protruded from the base member for clamping heat tubes and facilitating the installation.

(b) Description of the Prior Art

Regular cooler modules are commonly comprised of a metal base member, a plurality of heat tubes, and a plurality of radiation fins. The radiation fins may be extruded from aluminum or copper. The heat tubes are double closed-end metal tubes containing a working fluid. The base member is directly extruded from aluminum or copper. During installation, heat tubes are soldered to the base member with a solder paste or bonding agent. Further, if the heat tubes and the base member are made of different metal materials, a nickel-plating procedure is necessary before bonding. The use of a solder paste or bonding agent or the application of a nickel-plating procedure greatly increases the manufacturing cost of the cooler module. Therefore, manufacturing and installation of conventional cooler modules are complicated.

There are heat sinks in which the base member is secondarily processed to provide parallel mounting grooves and then the base member is compacted to secure the radiation pins in place after insertion of the radiation fins into the mounting grooves. However, the secondary processing the base member greatly increases the cost. Further, the limited contact surface area between the base member and the radiation fins does not allow quick transmission of heat energy from the base member to the radiation fins for quick dissipation.

U.S. Pat. No. 7,036,566, issued to the present inventor, discloses a cooler module entitled "HEAT DISSIPATING MODULE". According to this design, the heat dissipating module comprises a plurality of fins having same or different shapes, a plurality of heat dissipating tubes, and a seat. The fins are stacked one next to another, each fin having a plurality of upper penetrating holes and a plurality of lower grooves or holes. The seat is formed of solid metal with a plurality of slots, each slot corresponding to the lower groove of the fin and having two upper sides extended with two shaping sheets. When the two shaping sheets are pressed and bent, they form a round hole with the slot for receiving a heat dissipating tube. This invention will result in improved heat dissipation. Further, because the connection between the heat dissipating tubes and the seat eliminates the use of a solder paste or bonding agent, the installation of the heat dissipating module is quick and simple.

SUMMARY OF THE INVENTION

The present invention has been accomplished under the circumstances in view. It is one object of the present invention to provide a cooler module, which saves much of the material for the base member, thereby reducing the extruding cost of the base member. It is another object of the present invention to provide a cooler module, which keeps the radiation fins in direct contact with the heat tubes, thereby improving the heat dissipation efficiency. To achieve these and other objects of the present invention, the cooler module comprises a solid metal base member, a plurality of radiation fins, and a plurality of heat tubes. The base member has accommodation grooves, short clamping strips respectively extending along two sides of each accommodation groove, and positioning grooves between each two adjacent accommodation grooves. The heat tubes are U-shaped tubes, having the respective bottom ends respectively accommodated in the accommodation grooves and secured thereto by the clamping strips of the base member. The radiation fins each have a plurality of through holes, which receive the top ends of the heat tubes, a plurality of bottom notches respectively attached to the periphery of the bottom ends of the heat tubes, and a plurality of positioning strips respectively engaged into the positioning grooves of the base member. The clamping strips have a short height for clamping only a part of the periphery of the heat tubes, thereby saving the material for the base member and the extruding cost of the base member. Further, because the bottom edge of each radiation fin is kept in direct contact with the periphery of the heat tubes, the heat dissipation efficiency of the cooler module is high.

DETAILED DESCRIPTION OF THE PREFERRED EMBODIMENTS

Referring to FIGS. 1~5, a cooler module in accordance with a first embodiment of the present invention is shown. It comprises a set of radiation fins 1, a plurality of heat tubes 2, and a copper or aluminum base member 3.

Figure 1:
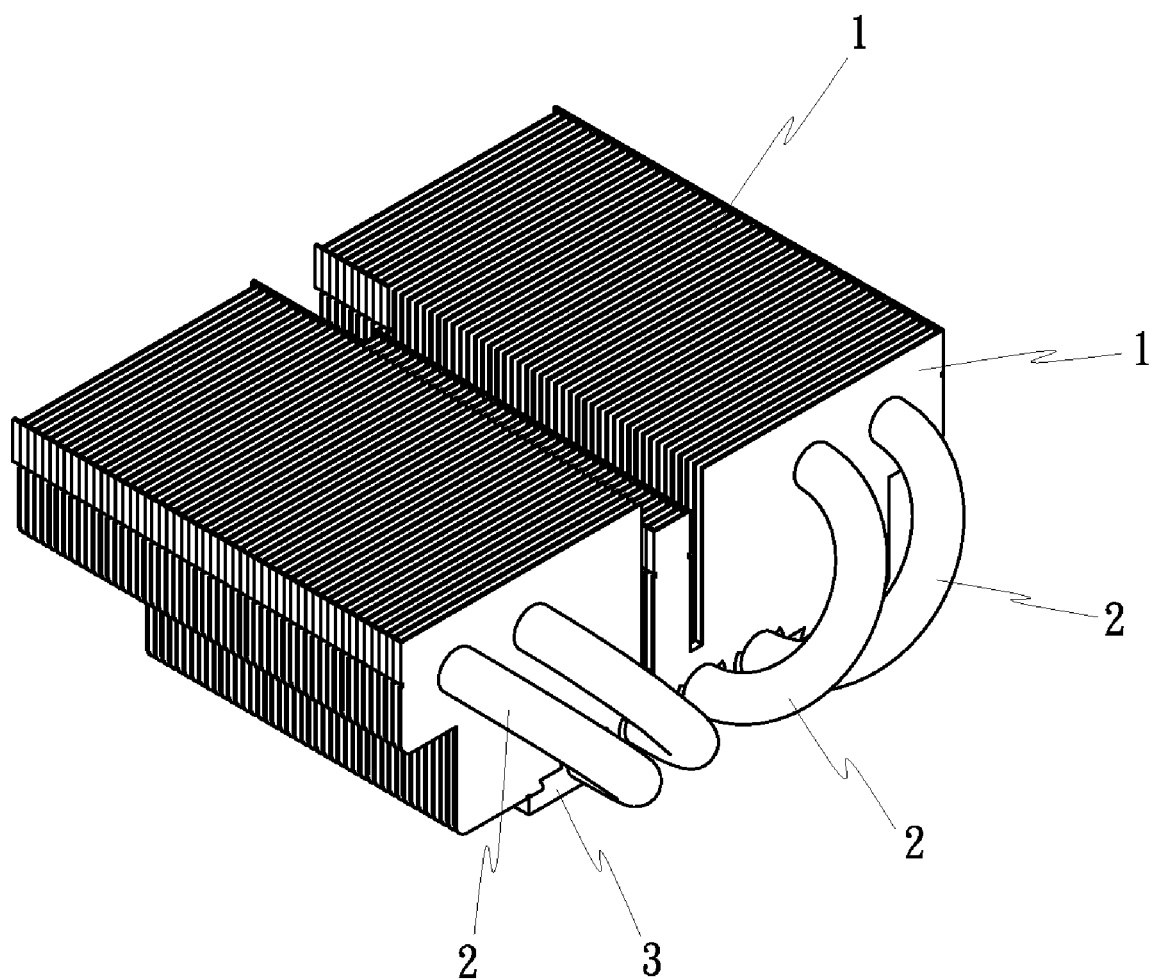
FIG. 1 is an oblique elevation of a cooler module in accordance with the present invention.
Figure 2:
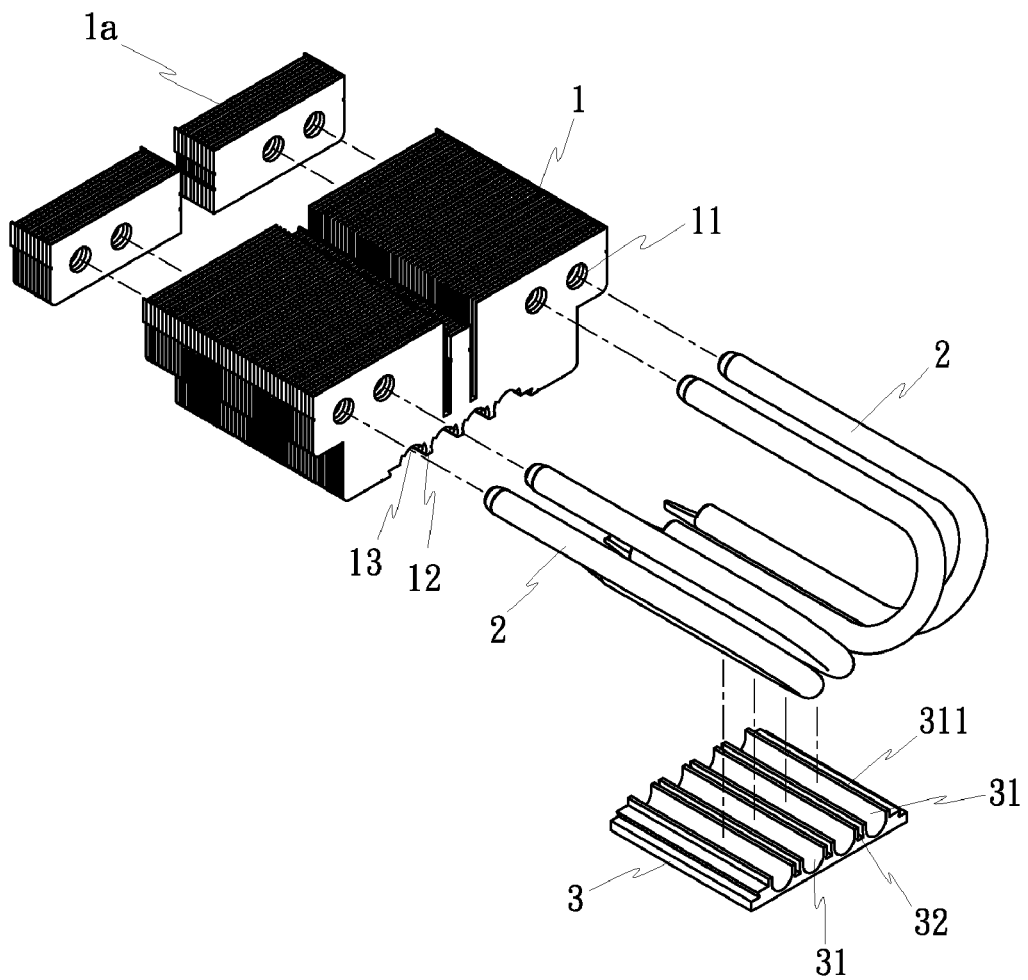
FIG. 2 is an exploded view of the cooler module according to the present invention.
Figure 3:
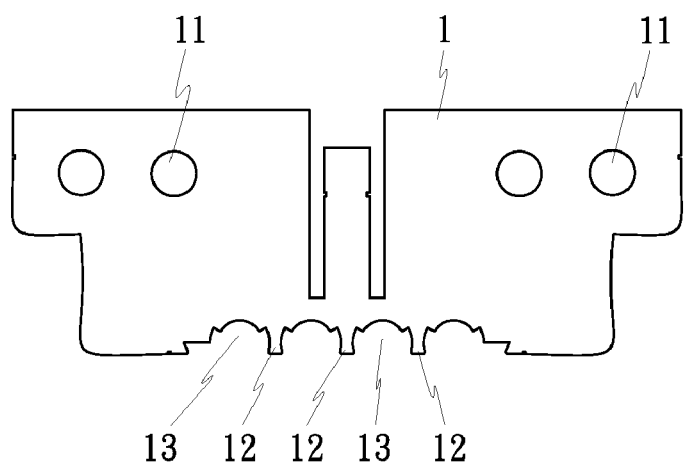
FIG. 3 is a front view of a radiation fin for the cooler module according to the present invention.

The radiation fins 1 are arranged in parallel, as shown in FIG. 3, each having a plurality of through holes 11 for the insertion of the heat tubes 2, and a plurality of bottom positioning strips 12 and arched bottom notches 13 alternatively arranged at the bottom side.

The heat tubes 2 are double closed-end tubes internally filled with a working fluid (not shown). The heat tubes 2 may have any of a variety of shapes.

Figure 4:
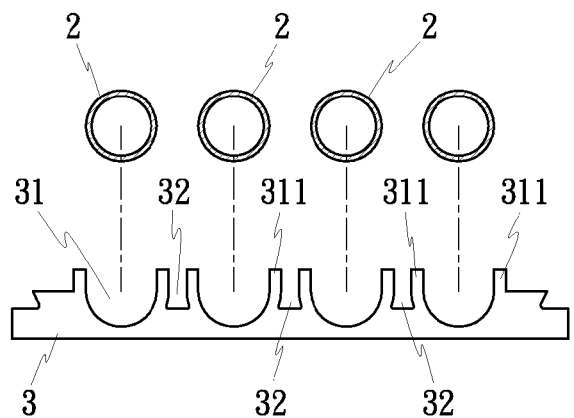
FIG. 4 is a schematic drawing of a part of the cooler module before installation of the heat tubes in the base member according to the present invention.
Figure 5:
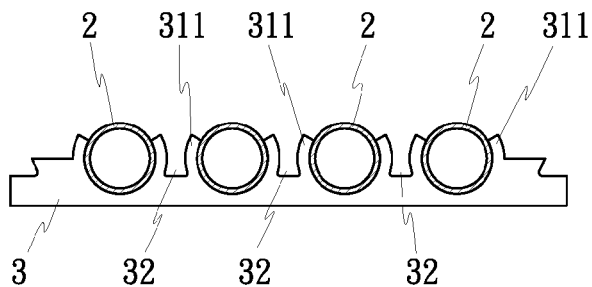
FIG. 5 corresponds to FIG. 4, showing the heat tubes installed in the base.

The base member 3, as shown in FIG. 4, is a solid flat metal block extruded from copper or aluminum, having a plurality of accommodation grooves 31 formed on the top wall for accommodating the heat tubes 2, a plurality of clamping strips 311 upwardly extending from the top wall along each of the two opposite lateral sides of each of the accommodation grooves 31, and a plurality of positioning grooves 32 respectively formed on the top wall between each two adjacent accommodation grooves 31. When the heat tubes 2 are respectively positioned in the accommodation grooves 31, the clamping strips 311 are deformed to clamp the heat tubes 2, thereby securing the heat tubes 2 firmly to the accommodation grooves 31 (see FIG. 5).

Figure 6:
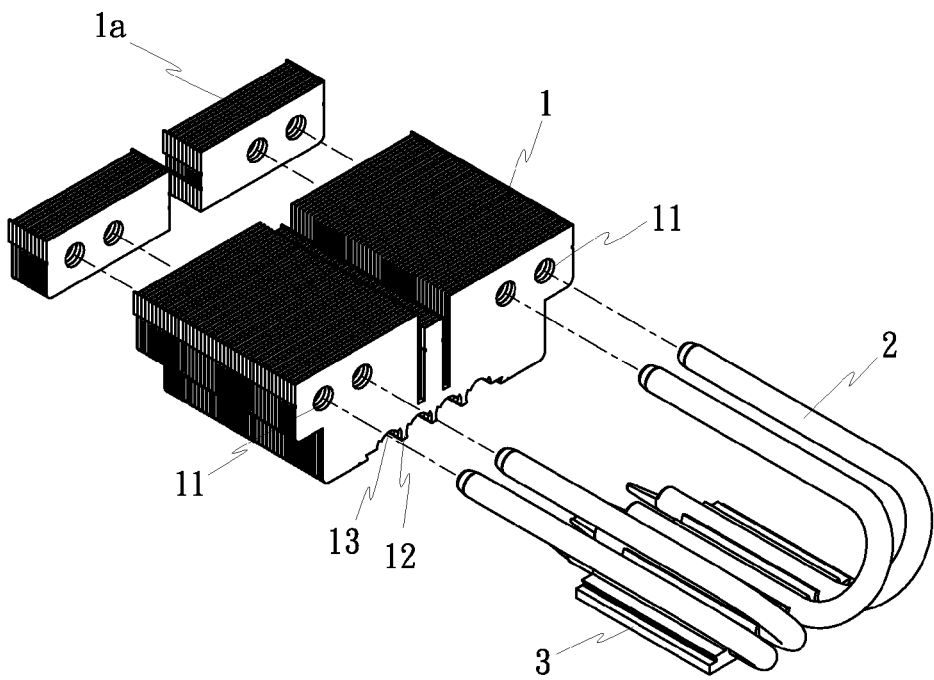
FIG. 6 corresponds to FIG. 2, showing the base member attached to the head tubes.
Figure 7:
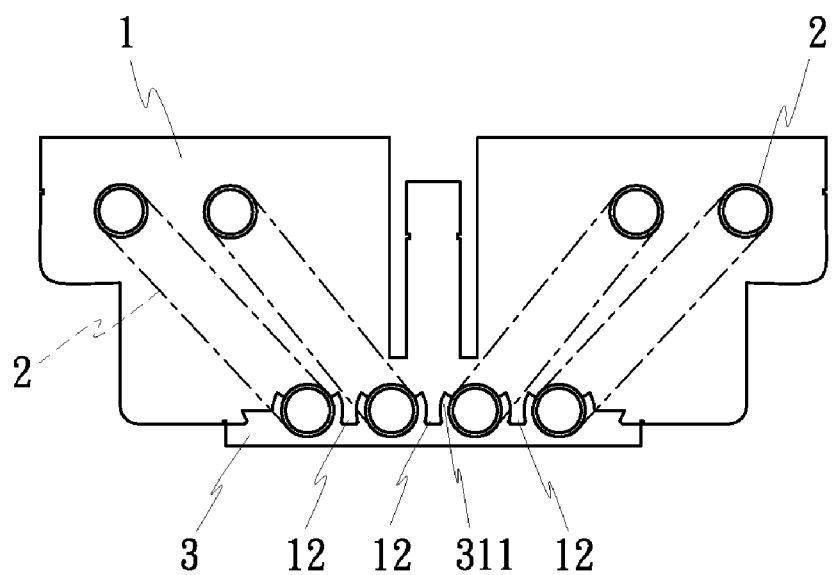
FIG. 7 is a schematic front view of the cooler module according to the present invention.
Figure 8:
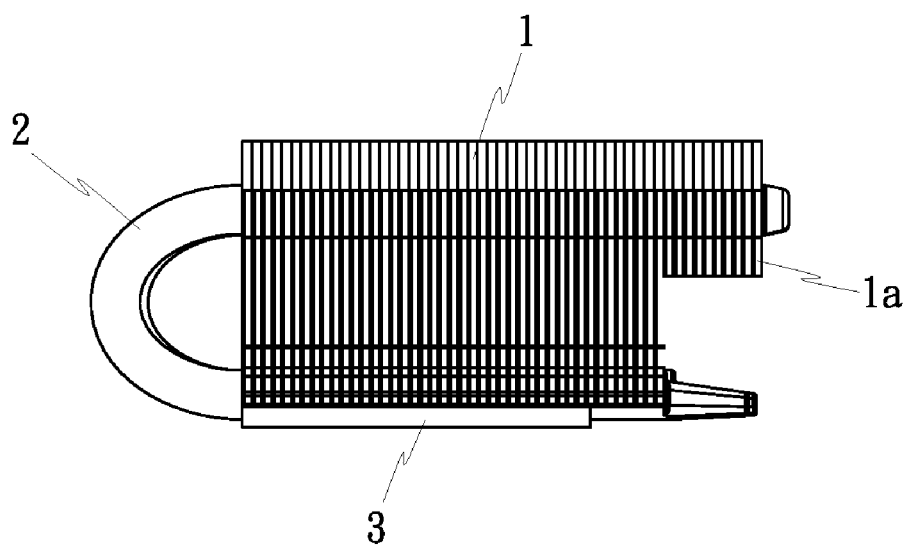
FIG. 8 is a schematic side view of the cooler module according to the present invention.

During installation, the heat tubes 2 are respectively attached to the accommodation grooves 31 of the base member 3, and then the clamping strips 311 are deformed to clamp the heat tubes 2, and then the radiation fins 1 are fastened to the heat tubes 2 and the base member 3 by: inserting the respective opposite ends of the heat tubes 2 through the through holes 11 and arched bottom notches 13 of the radiation fins 1 and forcing the respective bottom positioning strips 12 into the respective positioning grooves 32 (see FIGS. 6~8).

Because the bottom positioning strips 12 of the radiation fins 1 fit the positioning grooves 32 of the base member 3 and the arched bottom notches 13 of the radiation fins 1 fit the periphery of the heat tubes 2, the radiation fins 1 can easily and quickly be fastened to the heat tubes 2 and the base member 3.

Further, the clamping strips 311 have a limited height for clamping only a part of the periphery of the heat tubes 2, thereby saving the material for the base member 3 and the extruding cost of the base member 3.

Further, because the bottom edge of each radiation fin 1 is kept in direct contact with the heat tubes 2, the cooler module dissipates heat efficiently.

The cooler module may include supplementary radiation fins 1a that have a structure corresponding to the upper part of the radiation fins 1, i.e., the supplementary radiation fins 1a do not have the aforesaid bottom positioning strips 12 and arched bottom notches 13 and have only the through holes 11 for the insertion of the heat tubes 2.

Figure 9:
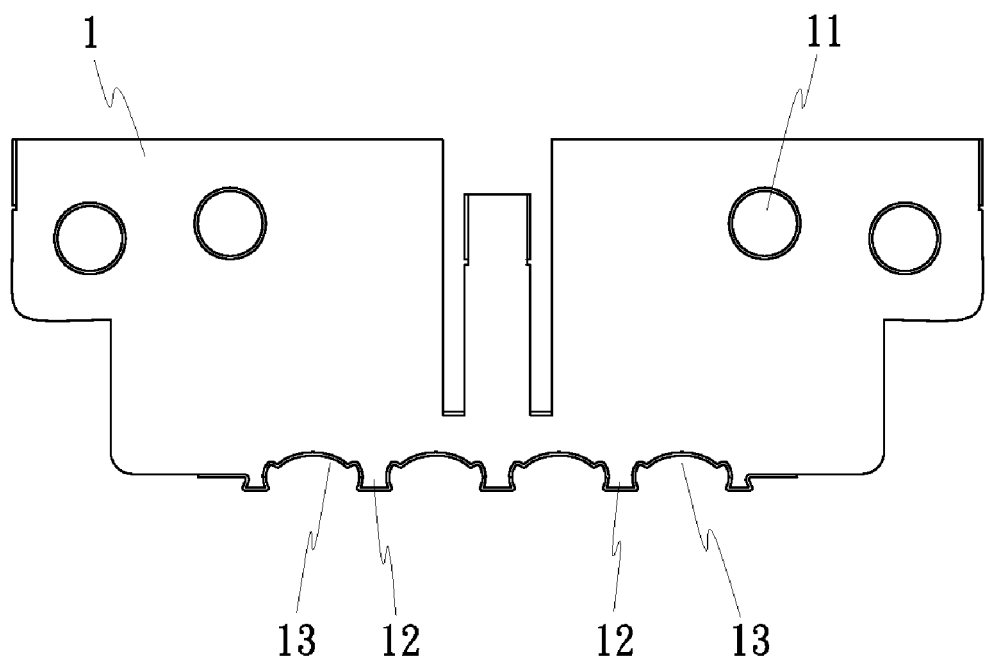
FIG. 9 shows an alternate form of the radiation fin according to the present invention.
Figure 10:
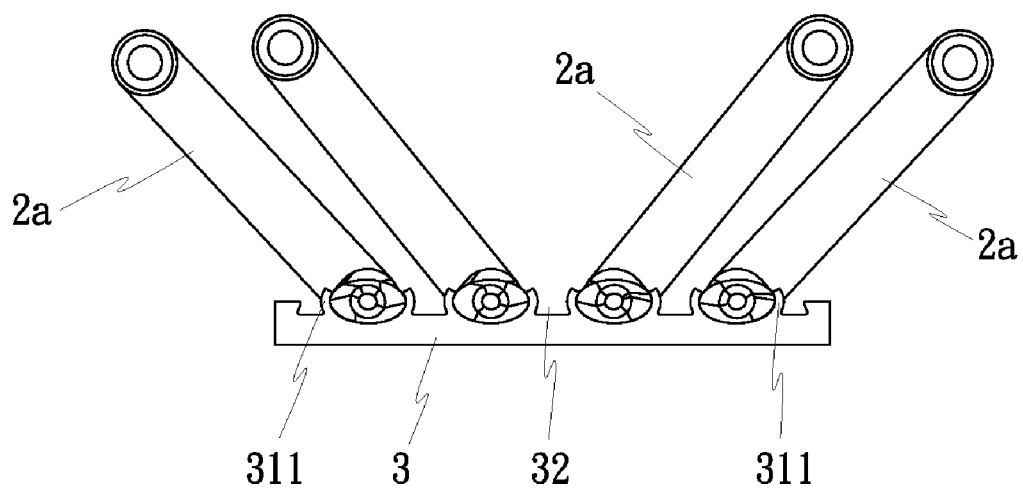
FIG. 10 is a schematic drawing showing oval heat tubes fastened to the base member according to the present invention.
Figure 11:
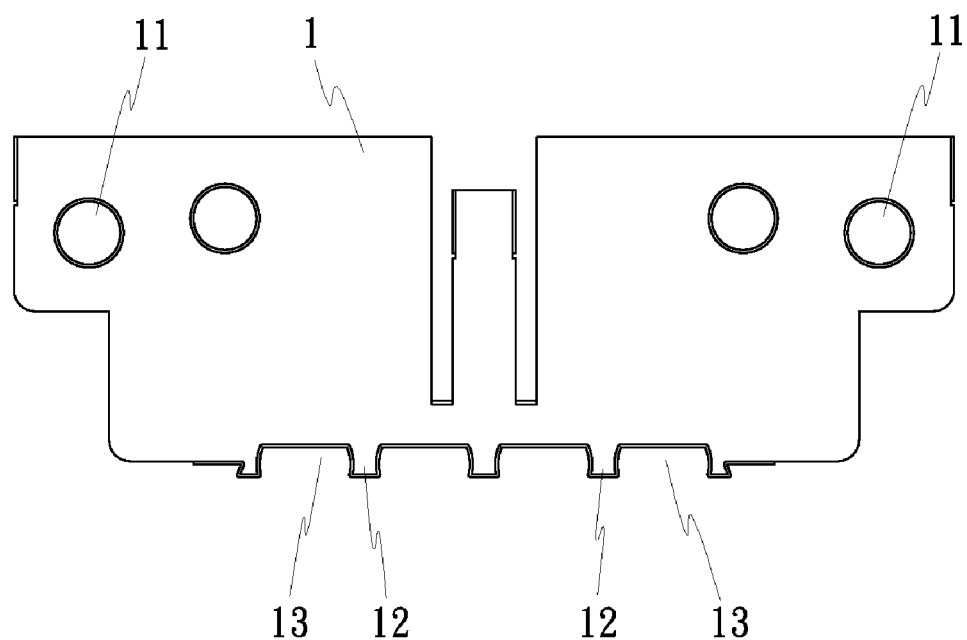
FIG. 11 shows still another alternate form of the radiation fin according to the present invention.
Figure 12:
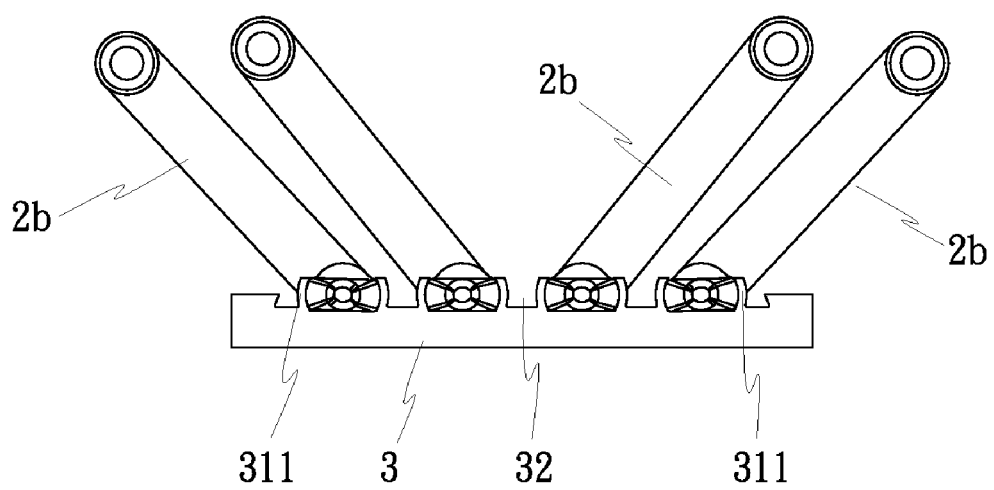
FIG. 12 is a schematic drawing showing flat heat tubes fastened to the base member according to the present invention.

Further, the accommodation grooves 31 and clamping strips 311 of the base member 3 are adapted to accommodate and clamp the heat tubes 2 respectively. Therefore, the cross section of the accommodation grooves 31 and the clamping strips 311 is determined subject to the cross section of the heat tubes 2. According to the embodiment shown in FIGS. 1~8, the heat tubes 2 have a circular cross section, and the accommodation grooves 31 and clamping strips 311 of the base member 3 are configured to fit the circular cross section of the heat tubes 2. According to the embodiment shown in FIGS. 9 and 10, the heat tubes 2a have an oval cross section to be accommodated in the base member 3, and the accommodation grooves 31 and clamping strips 311 of the base member 3 are configured to fit the oval cross section of the heat tubes 2a. According to the embodiment shown in FIGS. 11 and 12, the heat tubes 2b have a rectangular cross section, and the accommodation grooves 31 and clamping strips 311 of the base member 3 are configured to fit the rectangular cross section of the heat tubes 2b.

A prototype of cooler module has been constructed with the features of FIGS. 1~12. The cooler module functions smoothly to provide all of the features disclosed earlier.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A cooler module comprising
a base member,
a plurality of radiation fins fastened to said base member and arranged in parallel, and
a plurality of heat tubes fastened to said radiation fins, said heat tubes being double closed-end U-shaped tubes each containing a working fluid and each having a first end and a second end, wherein:
said base member is a solid metal block, having a top wall, a plurality of accommodation grooves formed on said top wall and arranged in parallel for accommodating the first ends of said heat tubes, a plurality of clamping strips respectively upwardly protruded from said top wall along two opposite sides of each of said accommodation grooves for clamping the first ends of said heat tubes when each pair of said clamping strips are deformed to wrap on two opposite detached peripheral areas of a respective one of the heat tubes to secure said heat tubes to said accommodation grooves, and a plurality of positioning grooves formed on said top wall between each two adjacent accommodation grooves;
said radiation fins are mounted on said base member in parallel, each having a plurality of through holes, which receive the second ends of said heat tubes, a plurality of bottom notches in direct contact with an upper periphery of the first ends of said heat tubes, and a plurality of positioning strips respectively engaged into the positioning grooves of said base member.

2. The cooler module as claimed in claim 1, wherein the bottom notches of said radiation fins are arched notches respectively separated by said positioning strips.

3. The cooler module as claimed in claim 1, wherein the positioning strips of said radiation fins fit the positioning grooves of said base member in shape.

4. The cooler module as claimed in claim 1, wherein the bottom notches of said radiation fins fit an upper periphery of said heat tubes in shape.

5. The cooler module as claimed in claim 1, further comprising a plurality of supplementary radiation fins respectively fastened to said heat tubes and arranged in parallel to said radiation fins and spaced from said radiation fins at one side, said supplementary radiation fins each having a plurality of through holes, which receive the second ends of said heat tubes.

6. The cooler module as claimed in claim 1, wherein said accommodation grooves of said base member fit a lower periphery of said heat tubes.

7. The cooler module as claimed in claim 1, wherein said base member is a solid copper block.

8. The cooler module as claimed in claim 1, wherein said base member is a solid aluminum block.

* * * * *